United States Patent [19]
Schuhmacher et al.

[11] Patent Number: 5,662,784
[45] Date of Patent: Sep. 2, 1997

[54] APPARATUS FOR APPLYING THIN LAYERS TO A SUBSTRATE

[75] Inventors: Manfred Schuhmacher, Alzenau; Erwin Winter, Hanau; Andreas Sauer, Hösbach; Dietmar Marquardt, Erlensee, all of Germany

[73] Assignee: Leybold AG, Hanau am Main, Germany

[21] Appl. No.: 622,443

[22] Filed: Mar. 25, 1996

[30] Foreign Application Priority Data

Apr. 11, 1995 [DE] Germany .................. 195 13 691.8

[51] Int. Cl.⁶ .................................................. C23C 14/34
[52] U.S. Cl. ....................... 204/298.07; 204/298.09; 204/298.11; 204/298.14; 204/298.06
[58] Field of Search ................. 204/298.07, 298.09, 204/298.11, 298.14, 298.06

[56] References Cited

U.S. PATENT DOCUMENTS

| | | | |
|---|---|---|---|
| 4,425,218 | 1/1984 | Robinson | 204/298.07 |
| 4,849,087 | 7/1989 | Meyer | 204/298.07 |
| 4,946,576 | 8/1990 | Dietrich et al. | 204/298.14 |
| 5,223,111 | 6/1993 | Lueft | 204/298.14 |

*Primary Examiner*—R. Bruce Breneman
*Assistant Examiner*—Rodney G. McDonald
*Attorney, Agent, or Firm*—Felfe & Lynch

[57] ABSTRACT

Hollow members having conduits for process gas and coolant are mounted in parallel on sidewall of a vacuum chamber with a sputtering cathode therebetween. Anode members having an L-shaped cross section are mounted over the hollow members and held in place by thumb screws in threaded bores of strips fixed to the chamber walls above the hollow members. Mask members having a Z-shaped cross section are mounted over the anodes and are also held in place by the thumb screws.

10 Claims, 4 Drawing Sheets

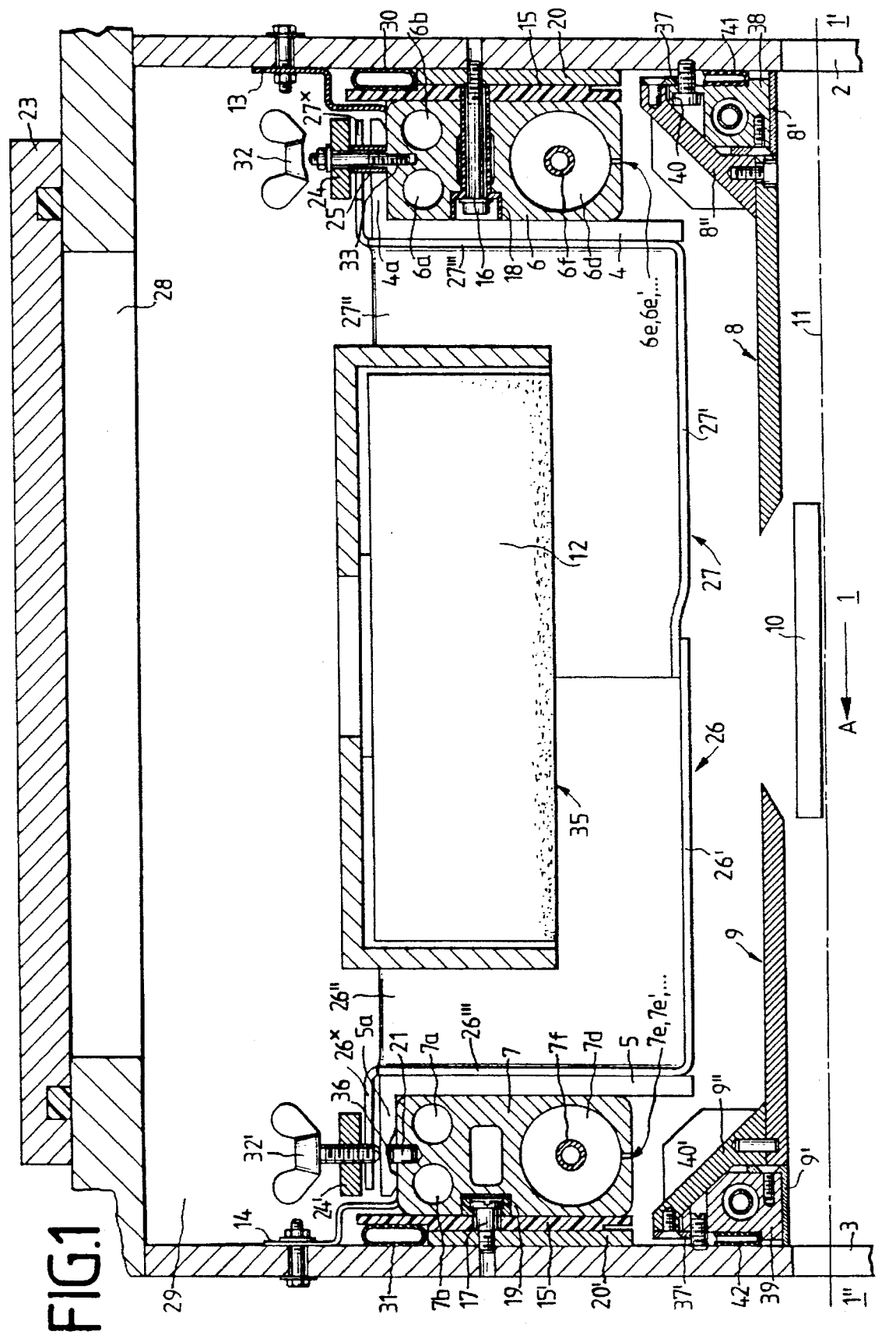

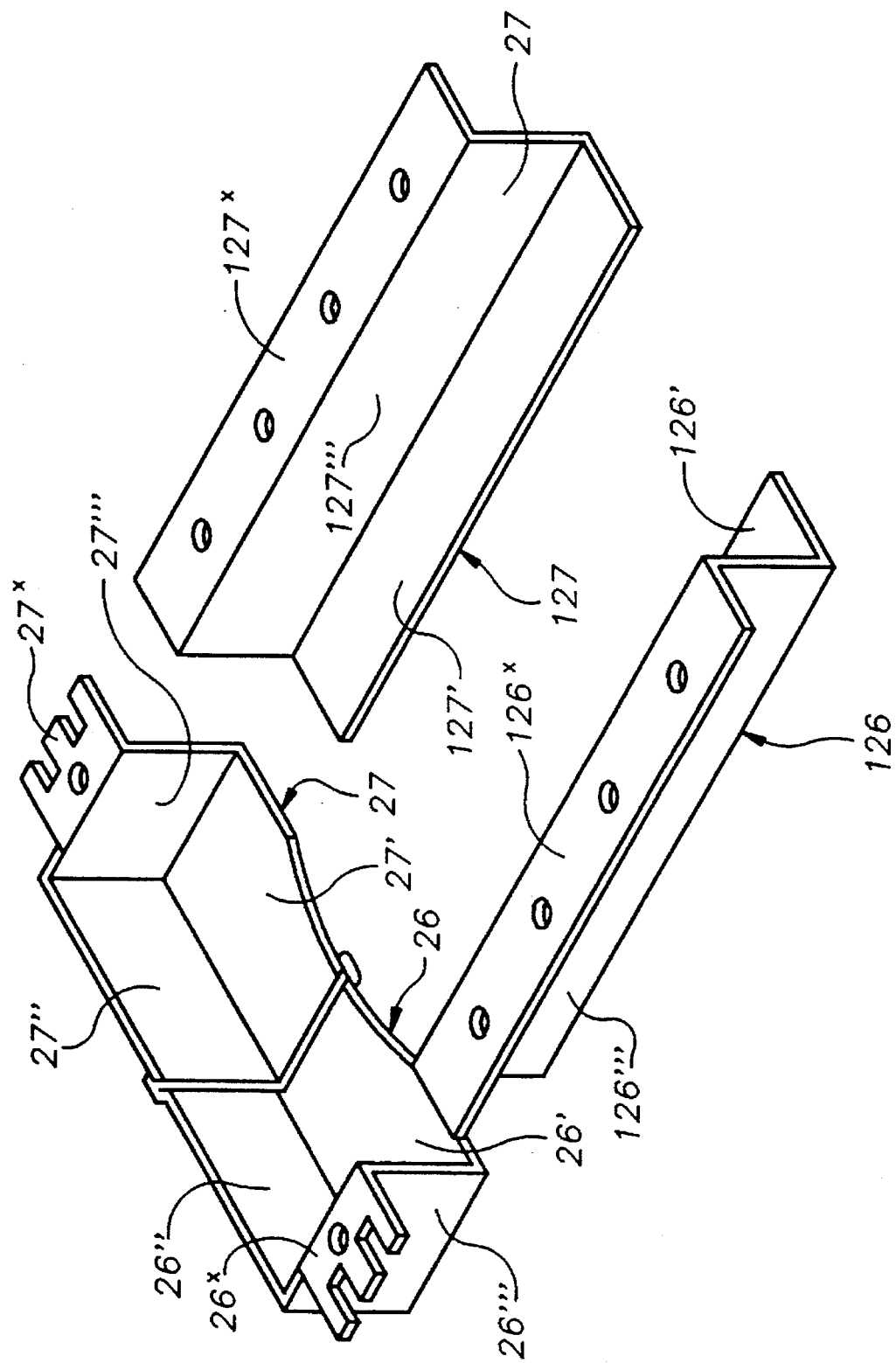

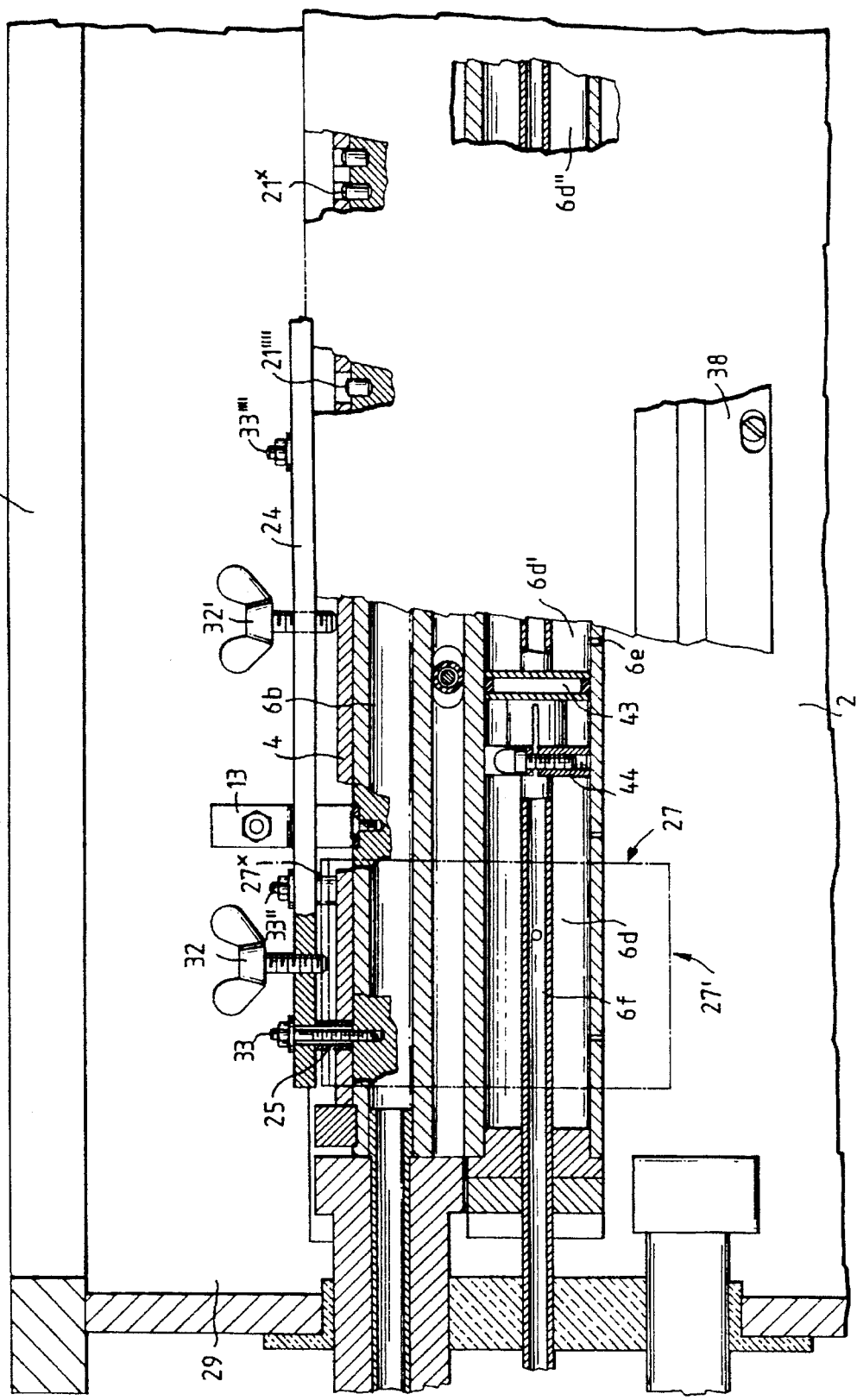

APPARATUS FOR APPLYING THIN LAYERS TO A SUBSTRATE

BACKGROUND OF THE INVENTION

The invention pertains to apparatus for applying thin layers to a substrate by means of the cathode sputtering process in a vacuum chamber, through which the substrate to be coated can be transported. The apparatus includes a diaphragm under the cathode to be sputtered, where the plane of the substrate extends underneath the anode. Members supported by the walls of the vacuum chamber are provided with conduits, through which a coolant and a process gas are conveyed. The conduits for the process gas are provided with openings, which are transverse to the longitudinal axis of the conduit and which allow the process gas to escape into the vacuum chamber.

U.S. Pat. No. 4,946,576 discloses cathode sputtering apparatus wherein a mechanical diaphragm is installed between the cathode to be sputtered and the anode to divide the space between the cathode and the substrate to be coated. This apparatus is equipped with several separate cooling pipes and gas pipelines to supply the system with cooling medium and process gas.

This known device suffers from the disadvantage that the cooling medium and the process gas are supplied and returned through separate, multi-component pipelines. The system is thus is highly susceptible to operating breakdowns and is also complicated to produce and maintain. The pipelines have bends, coils, screw joints, and soldered joints, which are under vacuum during the operation of the system. These conditions, under the additional influence of process-related heat, lead to hairline cracks and leaks in the pipelines. At first, these leaks merely impair the quality of the layers, by reducing, for example, the adhesive strength of the layer being applied to the substrate during the sputtering process. Subsequently, however, they lead inevitably to the total failure of the entire system, which is always associated with considerable labor and enormous cost.

To obtain a significant increase in operational reliability and thus to reduce the down times, to achieve a considerable simplification of the production and maintenance work, and thus to arrive at a significant reduction in the production and operating costs, U.S. Pat. No. 5,223,111 proposes that both the cooling medium and the process gas be conducted through conduits in a one-piece structural component in the form of a hollow member. Openings transverse to the longitudinal axis of the conduits are provided to allow the process gas to escape. The anodes and diaphragms are screwed directly to the hollow member.

In known devices of the type described above, the anodes become coated rather quickly during the sputtering process with an insulating layer, which considerably reduces their service life. The coated anodes must therefore be removed at regular intervals from the process chamber and freed of the insulating layer, for example by sandblasting, which represents a considerable interruption of the production process. Known anodes are attached to the walls of the process chamber by means of insulating bushings and Teflon strips, which project into the area of the sputtering zone. After a certain sputtering time, this arrangement leads to functional problems, because these parts are not cooled. As a result, the known anodes can be subjected to only modest thermal loads.

SUMMARY OF THE INVENTION

The present invention improves the known device in such a way that the replacement of the anodes and diaphragms can be easily accomplished from the top of the process chamber without the need for tools and Without eye contact. The service life of the anodes and the thermal load capacity of the diaphragms are also to be improved.

According to the present invention, the anodes are designed as profiled rails with an L-shaped cross section, the short shank of which extends over, and is supported by, the top surfaces of the hollow members. The anodes are positioned by studs, which extend upward from the tops of the members and fit into holes in the short shanks, and held in place by thumb screws which are accessible from above.

Each approximately plate-shaped diaphragm preferably has two shanks on the section facing the process chamber wall, the end surface of one shank being supported on the process chamber wall, while the other shank is approximately in the shape of a hook. The free end of the hook or a projection provided at this end of the shank extends over a strip or hollow member attached to the process chamber wall.

BRIEF DESCRIPTION OF THE DRAWING

FIG. 1 shows a section of a cathode station with hollow members attached to both walls of the process chamber and with L-shaped anodes and masks fixed to the hollow members;

FIG. 1A is a perspective view of the masks;

FIG. 2 shows a side view of a part of a hollow member according to FIG. 1, in partial longitudinal section.

DETAILED DESCRIPTION OF THE PREFERRED EMBODIMENT

Figure 3:
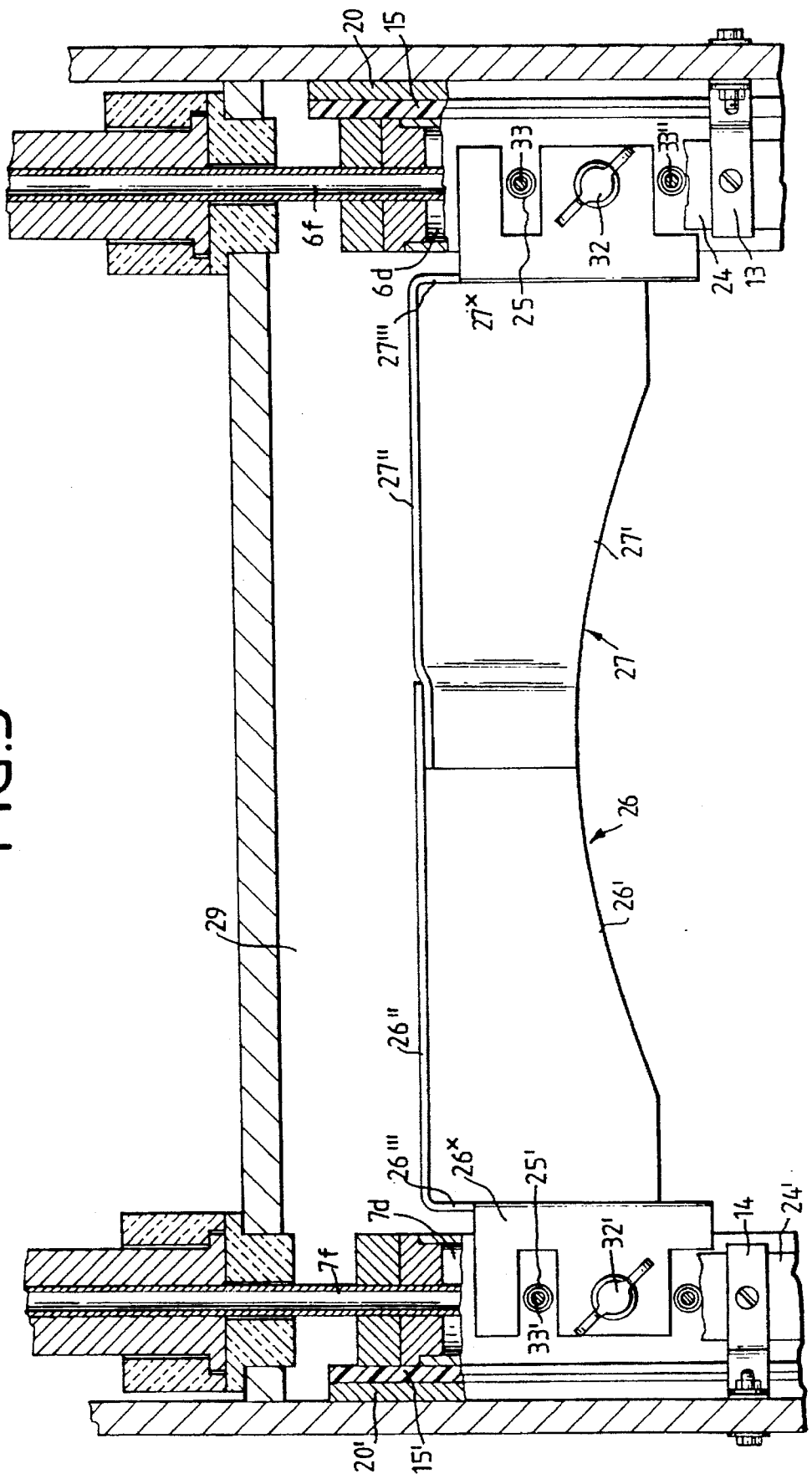
FIG. 3 shows a top view of a pair of end masks for the cathode station according to FIG. 1.

As FIG. 1 shows, a rectangular vacuum chamber 1 is installed between additional vacuum chambers 1', 1", the various chambers being connected to each other in a line by transfer locks (not shown in detail) in process chamber walls 2, 3.

In vacuum chamber 1, anodes 4, 5 are installed parallel to each other and crosswise to the substrate transport direction A and to the direction in which chambers 1, 1', and 1" are lined up in such a way that hollow, rectangular members 6, 7 and diaphragms 8, 9 extend inward toward the center of the chamber. Coolant feed conduits 6a, 7a and return conduits 6b, 7b are located in the hollow members, in which centrally situated gas distributor pipes 6f, 7f are also mounted. In addition, conduits 6d, 7d for the process gas are provided at the bottom with openings 6e, 6e', 7e, 7e', which recur at certain intervals, to allow the process gas to escape from conduits 6d, 7d into vacuum chamber 1. Substrate 10 can be transported in direction of travel A through vacuum chambers 1, 1', 1" along substrate plane 11, which extends horizontally underneath anodes 4, 5.

Cathode 12 with its flat target 35 is located above and between diaphragms 8, 9 and is parallel to hollow members 6, 7 and thus transverse to direction of travel A of the substrate.

Two Z-shaped sealing/guide plates 13, 14 are arranged in such a way that, together with sealing hoses 30, 31 of elastic material, they seal off the gap remaining between hollow members 6, 7 and process chamber walls 2, 3 of vacuum chamber 1.

Hollow members 6, 7 are insulated electrically by means of insulating plates 15, 15' and are rigidly joined by means of screws 16, 17 and spacers 20, 20' to process chamber walls 2, 3, for which purpose screws 16, 17 are in turn surrounded by insulating bushings 18, 19. Anodes 4, 5 are designed as L-shaped members, and each rests with its short shank 4a, 5a on the top surface of hollow member 6, 7, where they are held by means of holding pins 21, 21', anchored in the hollow members, and are clamped rigidly in place by means of thumb screws 32, 32'. Thumb screws 32, 32' are easily accessible through upper opening 28, which can be closed by a cover 23, and are for this purpose held in strips 24, 24', which, as seen in FIG. 2, are themselves screwed by way of spacer bushings 25, 25' to hollow members 6, 7. The two end walls 29 of each process chamber 1, 1', 1" are each shielded by a pair of end masks 26, 27 formed of pieces of sheet metal, which are also attached to the top surface of rectangular members 6, 7. As shown in FIG. 1A, each end mask 26, 27 consists of a bottom part 26', 27', an end wall part 26", 27", a side wall part 26''', 27''', and a collar part $26^x$, $27^x$. As also shown in FIG. 1A, side masks 126, 127 are formed as Z-shaped pieces having bottom parts 126', 127', sidewall parts 126''', 127''', and collar parts $126^x$, $127^x$.

Referring to FIGS. 1 and 2, strips 24, 24' extending along the top of one of hollow members 6, 7 have a plurality of threaded bores for thumb screws 32, 32', the threaded shafts of which pass through collar parts $126^x$, $127^x$ and rest on shanks 4a, 5a of anodes 4, 5 to hold them immovably on hollow members 6, 7. Strips 24, 24' are themselves screwed down by means of a row of screws 33, 33' with spacer bushings 25, 25', to hollow members 6, 7. Underneath each hollow member 6, 7 there is a diaphragm 8, 9, which is formed essentially of a first shank 8', 9', parallel to cathode 12 or its target surface 35, and a hook-like second shank 8", 9", which extends upward from the first shank at an angle of approximately 45°. Whereas the end of first shank 8', 9' facing away from cathode 12 rests against process chamber wall 2, 3 or against a second hollow member 38, 39, extending parallel to first hollow member 6, 7, the upper end of second shank 8", 9" extends with its nose-like projection 37, 37' over the top of hollow member 38, 39 or over a finger-like, vertical projection 40, 40' extending from the member. Hollow member 38, 39 is screwed to process chamber wall 2, 3 and is sealed with respect to process chamber wall 2, 3 by means of a sealing hose 41, 42. The second hollow members 38, 39 have conduits therein for coolant.

As FIG. 2 shows, lance or gas distributor pipe 6f, 7f has barrier rings 43, 43' distributed over its length, which can be slid back and forth along the pipe and which can be held in place by means of clamping pieces 44, 44' at precisely determined points on gas distributor pipe 6f, 7f. As a result, the sections or chambers 6d, 6d', 7d, 7d', separated by the barrier rings can be supplied independently with gas, and thus the individual nozzles 6e, 6e', 7e, 7e', can be supplied with gas at different flow rates. The combination of gas distributor pipe, barrier rings, and hollow member therefore makes it possible for the gas streams emerging from nozzles 6e, 6e', 7e, 7e', to be adjusted to the process parameters, and this makes it possible in turn for the layer being deposited on substrate 10 to be distributed uniformly.

Anodes 4, 5 according to the invention can be made of steel, which increases their service life. After thumb screws 32, 32' have been loosened, the anodes can be easily removed from chamber 1, 1' through opening 28, which leads to a reduction in the amount of time required to maintain the system.

What is claimed is:

1. Apparatus for coating a substrate by sputtering a target, said apparatus comprising a vacuum chamber having walls, hollow members mounted in parallel on respective walls, each hollow member having therein conduit means for coolant and process gas, and holes for dispensing process gas into said vacuum chamber, anode members mounted to respective hollow members, each anode member having an L-shaped cross section formed by a short shank and a long shank, said short shanks extending over said hollow members, said long shanks extending vertically from said short shanks, pins extending upward from said hollow members and bores in said short shanks, said pins being received in said bores to position said anode members on said hollow members, and a cathode mounted between said anodes.

2. Apparatus as in claim 1 further comprising strips fixed to said vacuum chamber walls above said hollow members, each strip having therein at least one threaded bore and screw means received in respective said threaded bores, said screw means bearing against said short shanks to hold said short shanks against said hollow members.

3. Apparatus as in claim 2 further comprising a plurality of masks, each mask having a Z-shaped cross-section comprising a collar part extending between one of said strips and said short shank of one of said anodes, a sidewall part extending vertically from said collar part between said long shank and said cathode, and a bottom part extending horizontally from said sidewall part, said collar parts having holes which receive said screw means therethrough.

4. Apparatus as in claim 1 further comprising a plurality of masks, each mask comprising a collar part received on one of said short shanks and a sidewall part extending vertically therefrom between said long shank and said cathode.

5. Apparatus as in claim 1 further comprising insulating plates between said hollow members and said walls of said vacuum chamber.

6. Apparatus as in claim 1 further comprising sealing plates located above the hollow members between the vacuum chamber walls and the hollow members.

7. Apparatus as in claim 1 wherein said hollow members are first hollow members, said apparatus further comprising second hollow members mounted in parallel on respective walls below said first hollow members, said second members having therein conduit means for coolant, and plate shaped diaphragm members mounted below said cathode and said anode members, each diaphragm member having a first shank extending above one of said second hollow members and a second shank extending below said one of said second hollow members.

8. Apparatus as in claim 7 wherein said first shanks of said diaphragm members comprise hook means for engaging said diaphragm members to respective said second hollow members.

9. Apparatus as in claim 1 further comprising barrier means in said conduit means for process gas, said barrier means dividing said conduit means into sections which can be provided with process gas independently.

10. Apparatus as in claim 9 further comprising a gas supply pipe located concentrically in said conduit means for said process gas, said barrier means comprising at least one barrier ring located concentrically on said supply pipe, said at least one barrier ring being movable.

\* \* \* \* \*

UNITED STATES PATENT AND TRADEMARK OFFICE
CERTIFICATE OF CORRECTION

PATENT NO. : 5,662,784
DATED : September 2, 1997
INVENTOR(S) : Schuhmacher et al.

It is certified that error appears in the above-identified patent and that said Letters Patent is hereby corrected as shown below:

On the cover, in the Abstract, line 2, change "sidewall" to -- sidewalls --.

In column 2, line 2, change "Without" to -- without --.

In Claim 3, column 4, line 26, change "anodes" to -- anode members --.

In Claim 3, column 4, line 28, after "shank" insert -- of one of said anode members --.

In Claim 7, column 4, line 45, after "second" insert -- hollow --.

In Claim 10, column 4, line 64, before "supply" insert -- gas --.

Signed and Sealed this

Twenty-seventh Day of June, 2000

Attest:

Q. TODD DICKINSON

Attesting Officer     *Director of Patents and Trademarks*